United States Patent
Chiu

(12)
(10) Patent No.: US 6,326,290 B1
(45) Date of Patent: Dec. 4, 2001

(54) LOW RESISTANCE SELF ALIGNED EXTENDED GATE STRUCTURE UTILIZING A T OR Y SHAPED GATE STRUCTURE FOR HIGH PERFORMANCE DEEP SUBMICRON FET

(75) Inventor: Chih-Chung Chiu, Chunan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/531,782

(22) Filed: Mar. 21, 2000

(51) Int. Cl.[7] ............... H01L 21/336; H01L 21/8234; H01L 21/3205; H01L 21/4763

(52) U.S. Cl. .................. 438/592; 438/197; 438/299; 438/585; 438/595

(58) Field of Search ........................... 438/197, 299, 438/585, 592, 595

(56) References Cited

U.S. PATENT DOCUMENTS

| | | |
|---|---|---|
| 4,829,025 * | 5/1989 | Iranmanesh . |
| 4,939,071 | 7/1990 | Barrera et al. ............... 430/314 |
| 5,053,849 | 10/1991 | Izawa et al. ............... 357/59 |
| 5,288,660 | 2/1994 | Hua et al. ............... 437/187 |
| 5,559,049 | 9/1996 | Cho ............... 437/44 |
| 5,585,307 | 12/1996 | Yoo ............... 437/187 |
| 5,688,704 | 11/1997 | Liu ............... 437/41 |
| 5,817,558 | 10/1998 | Wu ............... 438/291 |
| 5,856,232 | 1/1999 | Yang et al. ............... 438/574 |
| 5,966,597 * | 10/1999 | Wright . |
| 6,069,032 * | 5/2000 | Lee . |
| 6,239,007 * | 5/2001 | Wu . |

FOREIGN PATENT DOCUMENTS

407176544A * 7/1995 (JP) .
408264771A * 10/1996 (JP) .

OTHER PUBLICATIONS

Lin et al., "A Novel Self–Aligned T–Shaped Gate Process for Deep Submicron Si MOSFET's Fabrication", IEEE Electron Device Letters, vol. 19, No. 1, Jan. 1998, pp. 26–28.
A. Chatterjee et al., "Sub 100nm Gate Length Metal Gate NMOS Transistors Fabricated by a Replacement Gate Process", IEEE, C. 1997, journal not identified.
Wakabayashi et al., "A High–Performance 0.1nm CMOS with Elevated Salicide using Novel Si–SEG Process", IEEE, C. 1997, journal not identified.
Hisamoto et al., "A Low Resistance Self–Aligned T–Shaped Gate for High Performance Sub–0.1–nm CMOS", IEEE trans. on Electron Devices, vol. 44, No. 6, Jun. 1997, pp. 951–956.

* cited by examiner

Primary Examiner—John F. Niebling
Assistant Examiner—Ron Pompey
(74) Attorney, Agent, or Firm—George O. Saile; Stephen B. Ackerman

(57) ABSTRACT

Two alternate gate electrode structures are developed with expanded top portions of the gate electrode to maintain or reduce electrode effective sheet resistance improving high frequency performance and reducing gate delay in submicron FET ULSI devices. The method for producing these structures is presented. For one structure the top surface of the expanded portion of the electrode has an essentially flat surface such as would be represented in a T shaped gate element. With the alternative structure the top surface of the expanded portion of the electrode is inclined upward from near the center of the electrode. This surface angulation results in a Y shaped gate electrode element. Both structures effectively maintain or reduce electrode sheet resistance without increasing the underlying active channel length. The process is compatible with the self aligned gate process and is also compatible with salicidation methods. It provides the conventional LDD source drain regions as well as the vertical oxide gate electrode sidewall spacers.

20 Claims, 4 Drawing Sheets

LOW RESISTANCE SELF ALIGNED EXTENDED GATE STRUCTURE UTILIZING A T OR Y SHAPED GATE STRUCTURE FOR HIGH PERFORMANCE DEEP SUBMICRON FET

BACKGROUND OF THE INVENTION (1) Fields of the Invention

The present invention relates generally to fabrication of semiconductor devices and more particularly to a structure and a process which results in a field effect transistor (FET) semiconductor device salicided T shaped or alternatively, a Y shaped gate structure with reduced parasitic resistance and capacitance, and improved high speed performance.

(2) Description of Prior Art

As field effect transistor (FET) devices are scaled down to have channel lengths in the submicron and deep submicron ranges as required for the device densities of ultra large scale integration (ULSI), gate electrical characteristics can be degraded. This is particularly true for ultra high speed devices such as RF devices, whereby the increase in sheet resistance of the gate electrode structure with decreasing gate structure size, can degrade device high speed performance. Salilicided structures have been proposed for these ultra small gate elements, but the narrow line width effect causes an increase in the effective sheet resistance of the gate contact element, with salicide agglomeration a contributing factor, as well as creating difficulties with the fabrication process as the technology is scaled down to submicron and deep submicron regions.

When an ultra high speed integrated circuit is designed and fabricated, several high frequency characteristics are important. Gate structure sheet resistance is a contributing factor to cutoff frequency ($f_t$), gate parasitic resistance, gate delay time (charging constant), and maximum frequency performance. ($f_{max}$). In general, as channel length and subsequently gate length is decreased, high speed and high frequency performance is improved. However, the reduction of the gate length for devices in the submicron range causes a salicide agglomeration which usually increases the effective gate conductor sheet resistance, and hence degrades high speed performance characteristics. A T or Y shaped gate structure has the advantage of maintaining or increasing the area of the gate conductor without increasing the essential channel length. The increased area of a salicided T or Y gate structure will improve the effective sheet resistance of the gate electrode structure over a conventional gate structure, and may even reduce the effective resistance with decreasing gate length for certain salicides such as Co salicide. (See "A Novel Self-Aligned T-Shaped Gate Process for Deep Submicron Si FET Fabrication authored by Horng-Chih Lin et al., IEEE Electron Device Letters, Vol. 19, NO. 1 January 1998, pages 26 through 28.)

Metal T shaped gate electrode structures have been utilized in the art, but the manufacturing processes can be expensive, unduly complex, and not as compatible with Si ULSI processes as desired.

U.S. Pat. No. 5,053,849 issued to Izwa et al. shows an overlapping gate/drain two layer gate structure, U.S. Pat. No. 5,817,558 issued to Wu describing a T-shaped gate formed of amorphous silicon, U.S. Pat. No. 5,559,049 issued to Cho shows a T-gate structure with a single poly layer and capacitively coupled auxiliary side gates, U.S. Pat. No. 5,856,232 describes a T-gate made of contact metal, as does U.S. Pat. No. 5,288,660 issued to Hua et al.

The following technical reports discuss high performance gate structures.

A Novel Self-Aligned T shaped Gate Process for Deep Submicron Si MOSFET's Fabrication, author(s) Lin et al. IEEE Electron Device Letters, Vol. 19, No. 1, January 1998, pp26 to 28. Sub 100NM Gate length Metal Gate NMOS transistors fabricated by a replacement gate Process by Chatterjee et al., journal not identified.

A High Performance 0.1 um CMOS with Elevated Silicide using Novel Si SEG Process by Wakabayahi et al., journal not identified.

A Low Resistance Self Aligned T-Shaped Gate for High Performance Sub 0.1 Um CMOS by Hisamoto et al., IEEE transactions on Electron Devices, Vol. 44 No. 6, June 1997, pp. 951–956.

SUMMARY OF THE INVENTION

Accordingly, it is the primary objective of the invention to provide an effective and manufacturable method for improving FET salicided gate electrode sheet resistance by extending the electrode length without extending the active control length by using a T or Y shaped top portion of the gate electrode.

It is a further objective of this invention to maintain or improve the high frequency characteristics of submicron FET devices as circuit density increases with the advent of ULSI by maintaining or reducing FET gate electrode sheet resistance.

It is also an objective of this invention to utilize a salicide process compatible with ULSI FET processing while at the same time maintaining or improving high frequency performance of the devices.

In accordance with the objects of the invention, two alternate gate electrode structures are developed with expanded top portions of the gate electrode to alleviate salicide agglomeration thereby maintaining or reducing electrode resistance improving high frequency performance and reducing gate delay in submicron FET ULSI devices. The method for producing these structures is presented. For one structure the top surface of the expanded portion of the electrode has an essentially flat surface such as would be represented in a T shaped gate element. With the alternative structure the top surface of the expanded portion of the electrode is inclined upward from near the center of the electrode. This surface angulation results in a Y shaped gate electrode element. Both structures alleviate salicide agglomeration effectively maintaining or reducing electrode sheet resistance without increasing the underlying active channel length. The process is compatible with the self aligned gate process and is also compatible with salicidation methods. It provides the conventional LDD source drain regions as well as the vertical oxide gate electrode sidewall spacers

DESCRIPTION OF THE PREFERRED EMBODIMENTS

Figure 1:
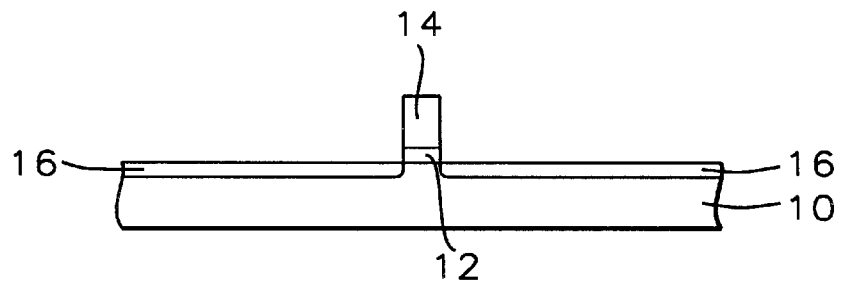
FIG. 1 shows a cross section through a partially manufactured semiconductor device showing a patterned polysilicon FET gate over gate oxide and initial source drain implantation.

Referring to FIG. 1 there is shown a semiconductor device substrate 10, typically of monocrystalline silicon. A layer of silicon dioxide ($SiO_2$) 12 is grown over the substrate surface, typically to a thickness of between 20 and 120 Angstroms (Å). This is followed by a deposition of polysilicon (poly) 14 to a thickness of between 100 and 300 nm which is appropriately patterned by photolithographic methods to form a vertical poly gate electrode element with an underlying layer of gate oxide 12. An implant step, typically of boron (B) or phosphorus (P) is done to form the basis of the lightly doped source/drain extensions (SDD/LDD) 16.

Figure 2:
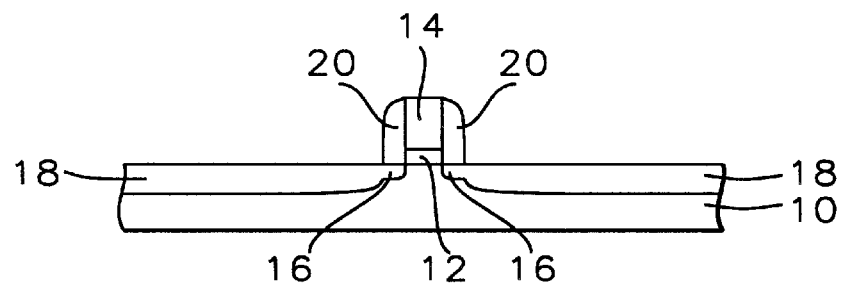
FIG. 2 shows the same polysilicon gate structure with the addition of tetraethylorthosilicate (TEOS) poly sidewall spacer and the LDD and main S/D dopant regions.
Figure 3:
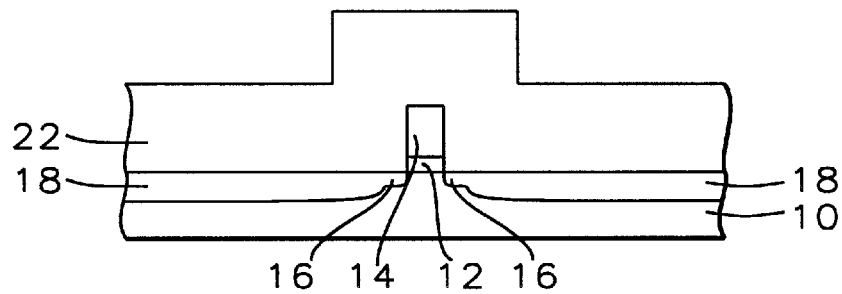
FIG. 3 shows a non-planarized layer of low temperature oxide (LTO) covering the structure.
Figure 4:
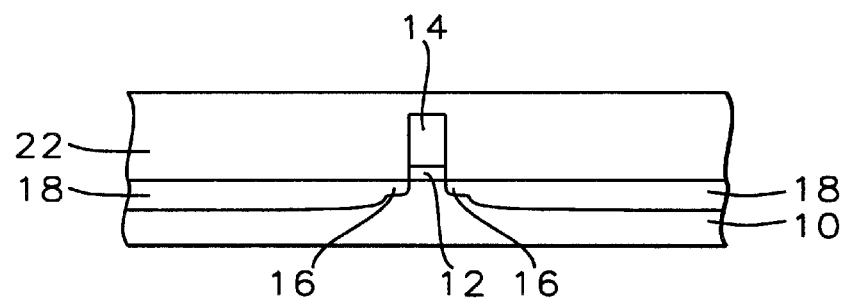
FIG. 4 shows the LTO after a chemical mechanical polishing (CMP) process.
Figure 5:
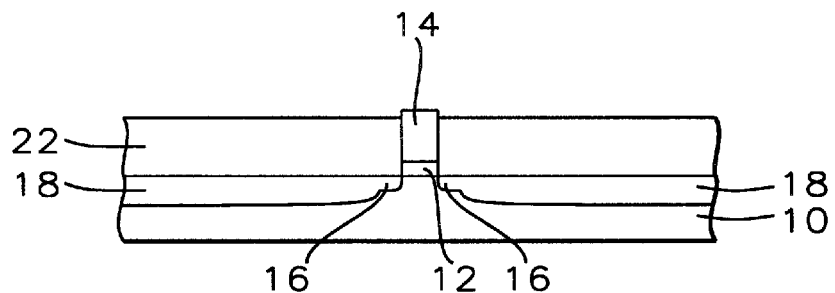
FIG. 5 shows the planarized LTO after a selective buffered oxide etch (BOE) with the top of the poly gate exposed.
Figure 6:
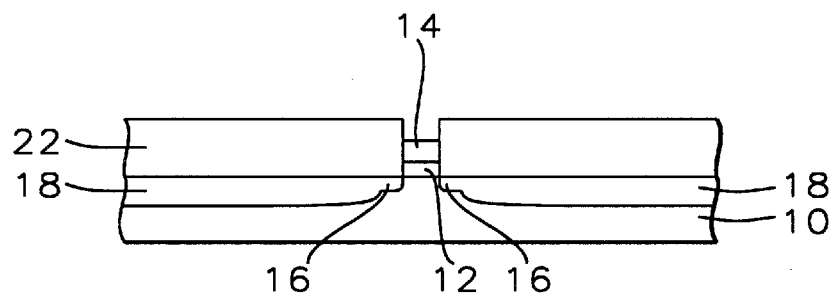
FIG. 6 shows the poly gate recessed within the LTO after a selective wet etch
Figure 7:
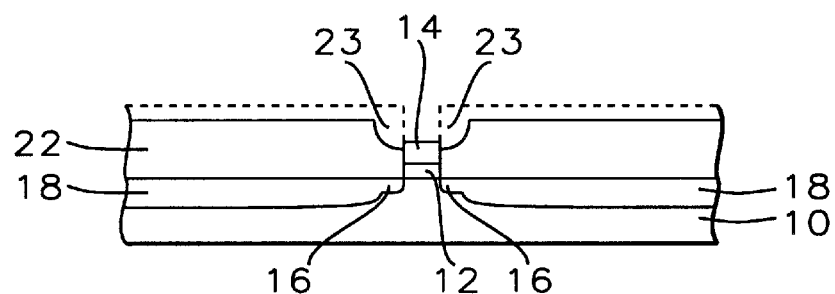
FIG. 7 shows the LTO after an isotropic etch with a depression created around the poly gate.

Referring to FIG. 2, tetraethylorthosylicide (TEOS) has been deposited, patterned and anisotropically etched to form a spacer 20 surrounding the vertical poly gate electrode 14. This spacer 20 is used to pattern the source/drain (S/D) heavy dopent implantation which is followed by a rapid thermal annealing (RTA) step to create the S/D regions 18 in the substrate 10. As depicted in FIG. 3, a low temperature oxide (LTO) 22 layer is deposited over the device surface, typically at a process temperature of between 700 and 800 degrees centigrade (° C.) and to a depth of between 540 and 660 nano meters (nm). The poly gate electrode topology results in a non planar surface for the LTO 22, in particular over the first poly electrode 14. FIG. 4 shows a planar LTO surface 22 after a chemical mechanical polishing or planarization (CMP) step. The LTO 22 is then selectively etched with a buffered oxide etch (BOE) until the top of the poly gate electrode 14 is exposed as shown in FIG. 5. The BOE solution is typically 1 part hydrofluoric acid (HF), an assay of 49%, to 10 parts of ammonium fluoride ($NH_4F$), assay of 40%. There follows a selective poly gate wet etch, typically a solution of nitric, hydrofluoric and acetic acids mixed with water, which reduces the poly electrode 14 height recessing it within the surrounding LTO 22 as shown in FIG. 6. There follows a second BOE isotropic etch using the same formulation as the first etch, which results in a depression 23 in the LTO in the region surrounding the poly gate electrode 14 as shown in FIG. 7.

Figure 8:
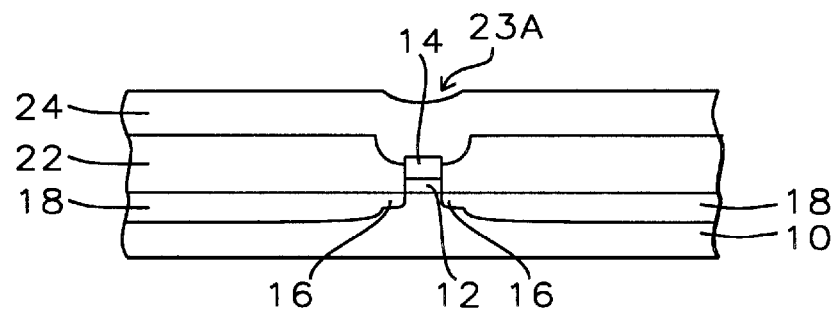
FIG. 8 is the device cross section after a second poly deposition covering the LTO and the original poly vertical gate structure.
Figure 9:
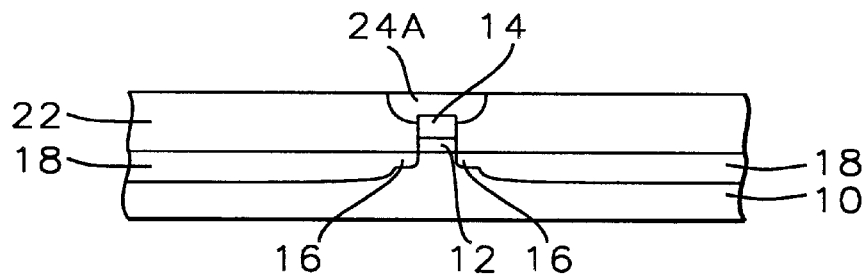
FIG. 9 shows the device cross section after a CMP planarization of the second poly deposition layer which essentially removes the second poly layer in all areas except the depressed region of the LTO. The remaining second poly effectively form an enlarged top portion of the vertical poly gate electrode or a T shaped electrode.

FIG. 8 shows a second layer of polysilicon 24 being deposited on the structure. The surface of this layer is not planar as it is nominally conformal to the depression 23 in LTO 22 in proximity to the first poly electrode region 14. FIG. 9 shows the result of a CMP process which has removed the second poly layer 24 except in depression area 23 of the LTO surrounding the first poly gate electrode. The second poly essentially forms an extended area cap 24A on top of the first poly electrode 14 producing an effective T shaped poly gate electrode element.

Figure 10:
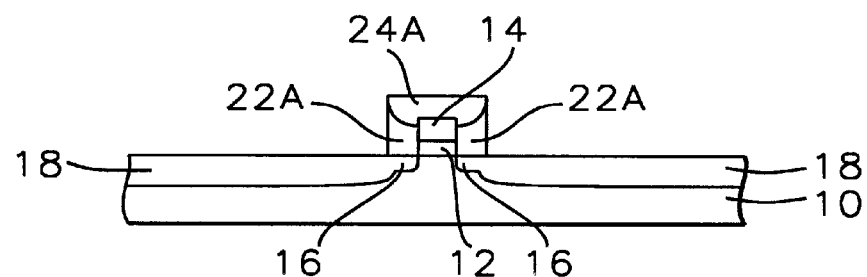
FIG. 10 shows the results of a selective dry anisotropic etch of the LTO which removes the LTO in all areas except below the enlarged top portion of the poly gate where the remaining LTO forms the poly electrode oxide spacer.

FIG. 10 shows the result of a selective dry anisotropic etch such as obtained from a reactive ion etch (RIE) process which removes the LTO in all regions except directly under the second poly extended cap 24A. The process selectively minimizes any etching of the poly cap. This remaining oxide forms the vertical side spacer 22A for the gate electrode element.

Figure 11:
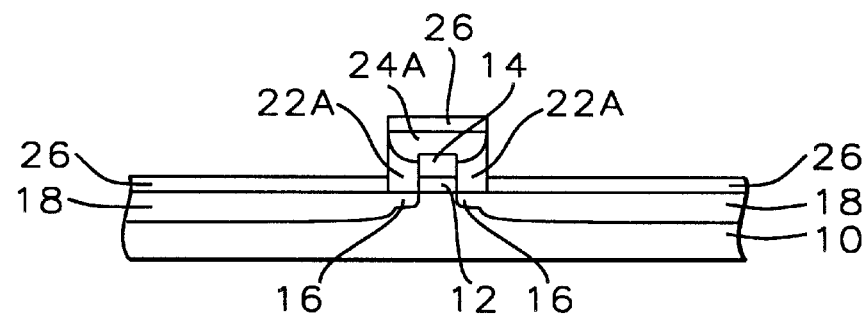
FIG. 11 shows a salicide layer covering the top of the poly T gate structure and the top of the source/drain regions.

FIG. 11 shows a salicide layer 26 over the gate poly 24A and the source drain regions 18. The salicide is typically formed from the deposition of a refractory metal such as titanium (Ti), tungsten (W), cobalt (Co), or tantalum (Ta). The salicide is formed when the metal is alloyed on a silicon surface to form $TiSi_2$, $WSi_2$, $CoSi_2$, or $TaSi_2$. The salicided T gate structure effectively increases the electrical contact area of the gate electrode and reduces salicide agglomeration thereby maintaining or reducing effective sheet resistance while enabling the narrow gate channel length necessary for small high speed devices required for ULSI.

Figure 12:
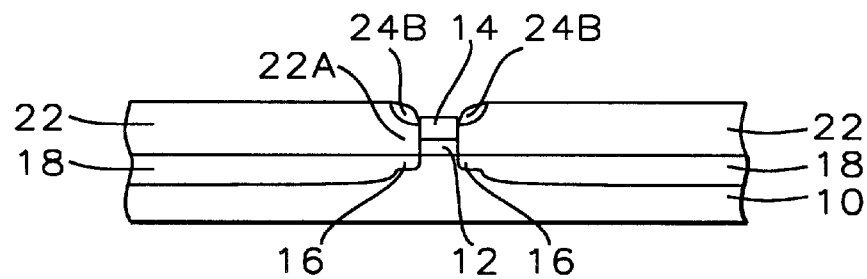
FIG. 12 shows a variation of the invention whereby the CMP planarization step represented in FIG. 9 is eliminated. The remaining process steps with anisotropic dry etching remove second poly and results in a Y shaped gate structure as shown.

FIG. 12 shows an alternative implementation of the invention. The initial process steps are the same as in the T gate process, up to the second poly 24 deposition. After the second poly deposition 24 shown in FIG. 8, the CMP planarization step is omitted. The second poly layer 24 has a surface depression 23A shown in FIG. 8 that approximates the depression in the underlying LTO 23 surrounding the first poly 14 gate element. A selective anisotropic dry etch such as a RIE process is applied to the second poly layer 24 etching the second poly down to the surface of the LTO layer 22, and exposing the top surface of the first poly gate electrode 14. The only remaining part of the second poly is the amount of second poly 24B that was embedded in the depression 23 in the LTO around the first poly 14 electrode. This element of the second poly 24B forms an expanded upper section of the poly gate electrode. The top surface of this second poly cap 24B is angulated from the top of the first poly electrode 14 rising up to the top of the LTO 22 at the periphery. This angulation forms an extended electrode area forming a Y shaped element, which minimizes salicide agglomeration and maintains or reduces the effective sheet resistance of the gate electrode while enabling the narrow gate channel length necessary for small high speed devices required for ULSI.

Figure 13:
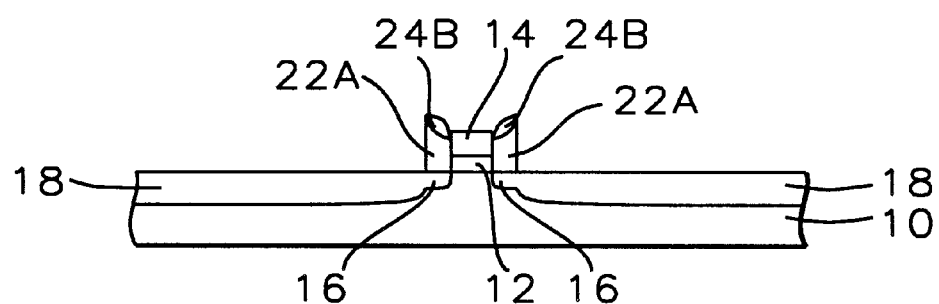
FIG. 13 is a cross section of the Y gate structure after a selective dry anisotropic etch removed all the LTO except under the second poly Y top of the gate forming the poly electrode oxide spacer.

FIG. 13 shows the result of a selective dry anisotropic etch which removes the LTO 22 in all regions except directly under the second poly extended Y electrode top 24B. This remaining oxide forms the vertical side spacer 22A for the gate electrode element.

Figure 14:
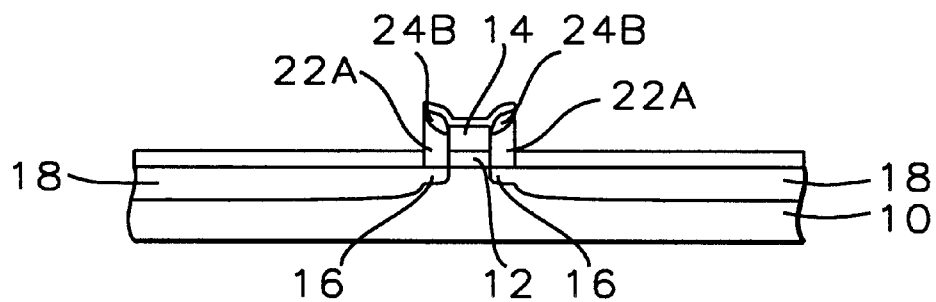
FIG. 14 is a cross section of the resultant Y gate structure with a covering of salicide over the poly and source drain regions.

FIG. 14 shows a salicide layer 26 over the gate poly 24B and first poly 14 and the source drain regions 18.

While the invention has been particularly shown and described with reference to the preferred embodiments thereof, it will be understood by those skilled in the art that various changes in form and details may be made without departing from the spirit and scope of the invention.

What is claimed is:

1. A method and novel process for forming a low resistance self aligned salicided T-shaped FET gate structure compatible with ULSI semiconductor processes comprising:

forming a gate oxide layer on a substrate active area, patterning a first polysilicon layer gate electrode and implanting a dopant as the basis of the S/D lightly doped extensions;

forming an oxide spacer on the vertical sides of said poly gate electrode and implanting the deep region dopant of said S/D region depositing an oxide layer over said poly electrode and said active device surface;

planarizing said oxide covered structure and selectively etching said oxide surface to expose top of said first poly gate electrode;

selectively etching said first poly electrode to recess it within said covering oxide;

isotropically etching said covering oxide to open a depression in said oxide around the top of said first poly electrode;

depositing and planarizing a second layer of polysilicon over said active device area so that second poly remains only in said depression on top of said first poly electrode and within said oxide covering layer forming a T shaped top of said gate electrode;

selectively dry etching said covering oxide layer with said oxide remaining on the vertical side of said first poly electrode between said active device surface and said second poly T shaped element forming said gate spacer oxide isolation;

forming salicide over said top surfaces of said second poly T shaped element and said device active area.

2. The method according to claim 1 wherein said covering oxide is low temperature oxide formed at a temperature of between 700 and 800 degrees C. (° C.) to a depth of between 540 and 660 nano meters (nm).

3. The method according to claim 1 whereby the planarization is performed by chemical mechanical polishing (CMP) methods which reduces the LTO thickness to between 360 and 440 nm.

4. The method according to claim 1 whereby the selective LTO etching is done using a buffered oxide etch containing 1 part of 49% HF and 10 parts of 40% $NH_4F$ which etches said LTO to a thickness between 270 and 300 nm effectively exposing the top of said first poly vertical gate element.

5. The method according to claim 1 whereby the selective etch of said first poly electrode is done by a wet etch to reduce said first poly to a height between 135 and 165 nm, recessing said electrode within said LTO.

6. The method according to claim 1 whereby the isotropic second etch of the LTO is done with a BOE solution with a concentration of HF and $NH_4F$ elements in a concentration of 1:10 to reduce the LTO to a thickness of between 180 and 220 nm, effectively creating a recess in said LTO around the top of said first poly gate element.

7. The method according to claim 1 whereby second poly deposition is deposited to a thickness of between 180 and 220 nm at a temperature between 520 and 640° C.

8. The method according to claim 1 whereby said second poly is planarized by a CMP down to the planar surface of said LTO leaving said second poly only in said recess in LTO around said top of said first poly gate element.

9. The method according to claim 1 whereby said LTO is selectively anisotropically dry etched by a RIE process with said oxide only remaining on said vertical side of said first poly electrode between said active device area and said second poly T shaped element forming said gate spacer oxide isolation.

10. The method according to claim 1 whereby a salicide of Titanium or Cobalt is formed over said top surface of said T gate electrode structure and the top surface of said source drain regions.

11. A method and novel process for forming a low resistance self aligned salicided Y-shaped FET gate structure compatible with ULSI semiconductor process comprising:

forming a gate oxide layer on a substrate active area, patterning a first polysilicon layer gate electrode and implanting a dopant as the basis of the S/D lightly doped extensions;

forming an oxide spacer on the vertical sides of said poly gate electrode and implanting the deep region dopant of said S/D region;

depositing a covering oxide layer over said poly electrode and said active device surface;

planarizing said oxide covered structure and selectively etching said oxide surface to expose top of said first poly gate electrode;

selectively etching said first poly electrode to recess it within said covering oxide;

isotropically etching said covering oxide to open a depression in said covering oxide around the top of said first poly electrode;

depositing a second layer of polysilicon over said covering oxide;

selectively dry etching said second poly so that said second poly only remains in said depression in said covering oxide around said first poly electrode forming a Y shaped gate electrode element;

selectively dry etching said covering oxide layer to form a vertical structure with said oxide remaining on the vertical side of first poly electrode between said active device surface and said second poly Y shaped element forming gate spacer oxide isolation;

forming salicide over top surfaces of said second poly Y shaped element and device active area.

12. The method according to claim 11 wherein said oxide covering is low temperature oxide formed at a temperature between 700 and 800° C. to a depth of between 540 and 660 nm.

13. The method according to claim 11 whereby the planarization is performed by chemical mechanical polishing (CMP) methods which reduces the LTO thickness to between 360 and 440 nm.

14. The method according to claim 11 whereby the selective LTO etching is done using a buffered oxide etch solution containing 1 part of 49% HF and 10 parts of 40% $NH_4F$ which etches said LTO to a thickness between 270 and 300 nm effectively exposing the top of said first poly vertical gate element.

15. The method according to claim 11 whereby the selective etch of said first poly electrode is done by a wet etch to reduce said first poly to a height between 135 and 165 nm, recessing said electrode within said LTO.

16. The method according to claim 11 whereby the isotropic second etch of the LTO is done with a BOE solution containing 1 part of 49% HF and 10 parts of 40% $NH_4F$ which etches said LTO to a thickness between 180 and 220 nm, effectively creating a recess in said LTO around said top of said first poly gate element.

17. The method according to claim 11 whereby said second poly is deposited to a thickness of between 180 and 220 nm at a temperature between 520 and 660° C.

18. The method according to claim 11 whereby said second poly is selectively dry etched to the top of said first poly electrode forming a second poly spacer around said first poly electrode forming a Y shaped electrode structure.

19. The method according to claim 11 whereby said LTO is selectively anisotropically dry etched by a RIE process with said oxide only remaining on said vertical side of said first poly electrode between said active device area and said second poly Y shaped element forming said gate spacer oxide isolation.

20. The method according to claim 11 whereby a salicide of Titanium or Cobalt is formed over said top surface of said Y gate electrode structure and the top surface of said source drain regions.

* * * * *